United States Patent
Pal et al.

(10) Patent No.: US 10,481,195 B2
(45) Date of Patent: Nov. 19, 2019

(54) DISTRIBUTED IOT BASED SENSOR ANALYTICS FOR POWER LINE DIAGNOSIS

(71) Applicant: PROPHECY SENSORS, LLC, Baltimore, MD (US)

(72) Inventors: Biplab Pal, Ellicott City, MD (US); Utpal Manna, Howrah (IN); Maniruz Zaman, Kolkata (IN)

(73) Assignee: MachineSense, LLC, Baltimore, MD (US)

( * ) Notice: Subject to any disclaimer, the term of this patent is extended or adjusted under 35 U.S.C. 154(b) by 364 days.

(21) Appl. No.: 14/956,403

(22) Filed: Dec. 2, 2015

(65) Prior Publication Data

US 2017/0160328 A1   Jun. 8, 2017

(51) Int. Cl.
G01R 31/02 (2006.01)
G06N 99/00 (2019.01)
G01R 31/08 (2006.01)
G06N 20/00 (2019.01)

(52) U.S. Cl.
CPC ........... *G01R 31/088* (2013.01); *G06N 20/00* (2019.01)

(58) Field of Classification Search
CPC .......................... G01R 31/088; G06N 99/005
USPC .......... 702/57, 58, 60, 62, 68, 183; 340/536, 340/657; 700/295; 701/1; 706/46; 709/204; 324/117 H, 543
See application file for complete search history.

(56) References Cited

U.S. PATENT DOCUMENTS

| | | |
|---|---|---|
| 5,150,289 A | 9/1992 | Badavas |
| 5,487,225 A | 1/1996 | Downie |
| 5,610,339 A | 3/1997 | Haseley et al. |
| 5,825,338 A | 10/1998 | Salmon et al. |
| 5,995,561 A | 11/1999 | Yamasaki et al. |
| 6,289,606 B2 | 9/2001 | Gillette et al. |
| 6,405,108 B1 | 6/2002 | Patel et al. |
| 7,406,399 B2 | 7/2008 | Furem et al. |
| 7,882,394 B2 | 2/2011 | Hosek et al. |
| 7,938,935 B2 | 5/2011 | MacHattie et al. |

(Continued)

FOREIGN PATENT DOCUMENTS

| | | |
|---|---|---|
| CN | 201672991 | 12/2010 |
| CN | 102539911 A | 7/2012 |

(Continued)

OTHER PUBLICATIONS

International Search Report and Written Opinion for PCT Application No. PCT/US2016/067814; dated Apr. 6, 2017.

(Continued)

*Primary Examiner* — John H Le
(74) *Attorney, Agent, or Firm* — Fox Rothschild LLP

(57) ABSTRACT

A method and system of a distributed power line diagnosis includes one or more electrical readings received at a firmware board computation engine and an output of firmware board engine computation being transmitted through a wide communication network to a data hub computation engine. An output of the data hub computation engine is transmitted through the communication network to a big data server. One or more electrical line issues are visualized based on an analysis through the big data server and the same can be indicated through a user interface dynamic and an alarm can be set as well through the processor for the one or more electrical line issues.

6 Claims, 11 Drawing Sheets

(56) References Cited

U.S. PATENT DOCUMENTS

| | | | |
|---|---|---|---|
| 8,021,462 B2 | 9/2011 | Moretto | |
| 8,094,034 B2 * | 1/2012 | Patel | H04B 3/544 |
| | | | 340/644 |
| 8,112,381 B2 | 2/2012 | Yuan et al. | |
| 8,126,574 B2 | 2/2012 | Discenzo et al. | |
| 8,150,340 B2 | 4/2012 | Albsmeier et al. | |
| 8,334,784 B2 * | 12/2012 | Patel | H04B 3/544 |
| | | | 340/12.32 |
| 8,390,299 B2 | 3/2013 | Laepple et al. | |
| 8,405,940 B2 | 3/2013 | Schweitzer, III et al. | |
| 8,421,475 B2 * | 4/2013 | Thiim | G01R 31/025 |
| | | | 324/117 H |
| 8,433,443 B2 | 4/2013 | Hagerty et al. | |
| 8,560,368 B1 | 10/2013 | Maity et al. | |
| 8,571,904 B2 | 10/2013 | Guru et al. | |
| 8,726,535 B2 | 5/2014 | Garrido et al. | |
| 8,868,242 B2 | 10/2014 | Loutfi | |
| 8,920,078 B2 | 12/2014 | Woolever | |
| 9,052,216 B2 | 6/2015 | Kamel et al. | |
| 9,062,536 B2 | 6/2015 | Fischer | |
| 9,250,275 B2 * | 2/2016 | Patel | H04B 3/544 |
| 2001/0038345 A1 * | 11/2001 | Satoh | B64F 1/18 |
| | | | 340/947 |
| 2002/0143421 A1 | 10/2002 | Wetzer | |
| 2004/0102924 A1 | 5/2004 | Jarrell | |
| 2004/0199573 A1 | 10/2004 | Schwarz et al. | |
| 2005/0222794 A1 | 10/2005 | Baird et al. | |
| 2006/0168195 A1 | 7/2006 | Maturana et al. | |
| 2006/0208169 A1 | 9/2006 | Breed et al. | |
| 2006/0276949 A1 | 12/2006 | Beck et al. | |
| 2007/0100518 A1 | 5/2007 | Cooper | |
| 2007/0185685 A1 | 8/2007 | Lannes et al. | |
| 2007/0193056 A1 | 8/2007 | Switalski | |
| 2008/0103732 A1 | 5/2008 | Stoupis | |
| 2008/0109185 A1 | 5/2008 | Cheung et al. | |
| 2008/0289045 A1 | 11/2008 | Fryer | |
| 2009/0024359 A1 | 1/2009 | Bibelhausen et al. | |
| 2009/0043518 A1 | 2/2009 | Roh et al. | |
| 2009/0119243 A1 | 5/2009 | Yuan et al. | |
| 2010/0023307 A1 | 1/2010 | Lee | |
| 2010/0169030 A1 | 7/2010 | Parlos | |
| 2010/0199352 A1 | 8/2010 | Hill et al. | |
| 2010/0295692 A1 | 11/2010 | Bjorn | |
| 2011/0016199 A1 | 1/2011 | De Carlo et al. | |
| 2011/0131398 A1 | 6/2011 | Chaturvedi et al. | |
| 2011/0137697 A1 | 6/2011 | Yedatore et al. | |
| 2011/0216805 A1 | 9/2011 | Fernando et al. | |
| 2012/0045068 A1 | 2/2012 | Kim et al. | |
| 2012/0166142 A1 | 6/2012 | Maeda et al. | |
| 2012/0209569 A1 | 8/2012 | Becourt et al. | |
| 2012/0213098 A1 | 8/2012 | Sun | |
| 2012/0271576 A1 | 10/2012 | Kamel | |
| 2012/0290104 A1 | 11/2012 | Holt et al. | |
| 2012/0330499 A1 | 12/2012 | Scheid et al. | |
| 2012/0330614 A1 | 12/2012 | Kar | |
| 2013/0102284 A1 | 4/2013 | Storozuk | |
| 2013/0170417 A1 | 7/2013 | Thomas et al. | |
| 2013/0173178 A1 | 7/2013 | Poczka et al. | |
| 2013/0201316 A1 | 8/2013 | Binder et al. | |
| 2013/0268469 A1 | 10/2013 | Sharma et al. | |
| 2013/0287060 A1 | 10/2013 | Langdoc et al. | |
| 2013/0304677 A1 | 11/2013 | Gupta et al. | |
| 2013/0318022 A1 | 11/2013 | Yadav et al. | |
| 2014/0129164 A1 | 5/2014 | Gorbold | |
| 2014/0163416 A1 | 6/2014 | Shuck | |
| 2014/0207394 A1 | 7/2014 | Madden | |
| 2014/0223767 A1 | 8/2014 | Arno | |
| 2014/0244836 A1 | 8/2014 | Goel et al. | |
| 2014/0262130 A1 | 9/2014 | Yenni | |
| 2014/0309805 A1 | 10/2014 | Ricci | |
| 2014/0314284 A1 | 10/2014 | Movellan et al. | |
| 2014/0335480 A1 | 11/2014 | Asenjo et al. | |
| 2014/0336791 A1 | 11/2014 | Asenjo et al. | |
| 2014/0337429 A1 | 11/2014 | Asenjo et al. | |
| 2015/0026044 A1 | 1/2015 | Refaeli | |
| 2015/0039250 A1 | 2/2015 | Rank | |
| 2015/0094914 A1 | 4/2015 | Abreu | |
| 2015/0139817 A1 | 5/2015 | Kowalski | |
| 2015/0181313 A1 | 6/2015 | Murphy | |
| 2015/0185251 A1 | 7/2015 | Heydron et al. | |
| 2016/0086285 A1 | 3/2016 | Jordan Peters et al. | |
| 2016/0147205 A1 | 5/2016 | Kaufman | |
| 2016/0189440 A1 | 6/2016 | Cattone | |
| 2016/0209831 A1 | 7/2016 | Pal | |
| 2016/0245279 A1 | 8/2016 | Pal et al. | |
| 2016/0245686 A1 | 8/2016 | Pal et al. | |
| 2016/0245765 A1 | 8/2016 | Pal | |
| 2016/0291552 A1 | 10/2016 | Pal et al. | |
| 2016/0299183 A1 | 10/2016 | Lee | |
| 2016/0313216 A1 | 10/2016 | Pal et al. | |
| 2016/0349305 A1 | 12/2016 | Pal | |
| 2017/0060574 A1 | 3/2017 | Malladi et al. | |
| 2017/0061608 A1 | 3/2017 | Kim et al. | |
| 2017/0163444 A1 | 6/2017 | McLaughlin et al. | |
| 2017/0201585 A1 | 7/2017 | Doraiswamy et al. | |

FOREIGN PATENT DOCUMENTS

| | | |
|---|---|---|
| CN | 103399486 A | 11/2013 |
| CN | 203362223 U | 12/2013 |
| CN | 203588054 U | 5/2014 |
| CN | 104036614 A | 9/2014 |
| EP | 1836576 B1 | 2/2012 |
| EP | 2186613 B1 | 5/2013 |
| EP | 2648393 A1 | 10/2013 |
| WO | WO 2005/086760 A2 | 9/2005 |
| WO | WO 2010/104735 A1 | 9/2010 |
| WO | WO 2013/040855 A1 | 3/2013 |
| WO | WO 2013-0041440 A1 | 3/2013 |
| WO | WO 2013/093942 A2 | 6/2013 |
| WO | WO 2014/044906 A1 | 3/2014 |
| WO | WO 2014/085648 A1 | 6/2014 |
| WO | WO 2014/089567 A2 | 6/2014 |
| WO | WO 2014/117245 A1 | 8/2014 |
| WO | WO 2015/022036 A1 | 2/2015 |
| WO | WO 2016/137848 A1 | 9/2016 |
| WO | WO 2017-1234525 A1 | 7/2017 |

OTHER PUBLICATIONS

International Search Report and Written Opinion for PCT Application No. PCT/US2016/067546; dated Apr. 11, 2017.

International Search Report and Written Opinion for PCT Application No. PCT/US16/18820; dated Aug. 4, 2016.

International Search Report and Written Opinion for PCT Application No. PCT/US15/066547; dated Mar. 17, 2016.

Sensors Drive Mobile IoT; Wong, William; Jan. 26, 2015; Electronic Design.

International Search Report and Written Opinion for PCT Application No. PCT/US16/028724; dated Aug. 22, 2016.

International Search Report and Written Opinion for PCT Application No. PCT/US16/18831; dated Aug. 12, 2016.

Continuous Hidden Markov Model Based Gear Fault Diagnosis and Incipient Fault Detection by Jian-She Kang, et al., dated Jun. 2011, published by Institute of Electrical and Electronics Engineers (IEEE).

Study on Fault Diagnosis of Gear with Spall using Ferrography and Vibration Analysis by Wei Feng, et al., published in Aug. 2009 at the International Conference on Measuring Technology and Mechatronics Automation.

Detection of Generalized-Roughness Bearing Fault by Spectral-Kurtosis Energy of Vibration or Current Signals by Fabio Immovilli, et al., IEEE Transations on Industrial Electronics, vol. 56, No. 11, Nov. 2009.

Intrinsic Mode Function Determination of Faulty Rolling Element Bearing Based on Kurtosis by Wei Kang, et al., Proceeding of the 2015 IEEE International Conference on Information and Automation, Lijiang, China, Aug. 2015.

Condition Monitoring and Fault Diagnosis of Rolling Element Bearings Based on Wavelet Energy Entropy and SOM by Shuai Shi, et al., dated Aug. 2012, published by IEEE.

(56) References Cited

OTHER PUBLICATIONS

Fault Diagnosis of Bearing Based on Fuzzy Support Vector Machine, by Haodong Ma, et al., dated Jan. 2015, published by IEEE.

Investigation of the Mechanical Faults Classification using Support Vector Machine Approach by Zhiqiang Jiang, et al., dated Aug. 2010, 2010 Second International Conference on Intelligent Human-Machine Systems and Cybernetics.

Impact Characterization of Multiple-Points-Defect on Machine Fault Diagnosis by Muhammad F. Yaqub, et al., 8th IEEE International Conference on Automation Science and Engineering, Aug. 20-24, 2012, Seoul, Korea.

Detection of Precursor Wear Debris in Lubrication Systems by Jack Edmonds, et al., dated May 2000, published by IEEE.

A Diagnostic Expert System Embedded in a Portable Vibration Analysis Instrument by Dr. Robert Milne, et al., dated May 13, 1991, published at IEE Colloquium on Intelligent Instrumentation.

Fault Diagnosis Method Study in Roller Bearing Based on Wavelet Transform and Stacked Auto-encoder, by Junbo Tan, et al., dated Feb. 2015, published by IEEE.

Fault Monitoring and Diagnosis of Induction Machines Based on Harmonic Wavelet Transform and Wavelet neural Network by Qianjin Guo, et al., dated Sep. 2008, published at the Fourth International Conference on Natural Computation.

Fault Detection in Kerman Combined Cycle Power Plant Boilers by Means of Support Vector Machine Classifier Algorithms and PCA by M. Berahman, et al., 3rd International Conference on Control, Instrumentation, and Automation (ICCIA 2013), Dec. 28-30, 2013, Tehran, Iran.

Krishnamurthy, S. et al. (2008) Automation of Facility Management Processes Using Machine-to-Machine Technologies. In: Floerkemeier C., Langheinrich M., Fleisch E., Mattern F., Sarma S.E. (eds) The Internet of Things. Lecture Notes in Computer Science, vol. 4952. DOI:10.1007/978-3-540-78731-0_5 (Year: 2008).

Holler, J. et al. (2014). "From Machine-to-machine to the Internet of Things: Introduction to a New Age of Intelligence." Chapters 2, 4, 5, 7, 10, 12. Academic Press. DOI:10.1016/B978-0-12-407684-6.00002-4 (Year: 2014).

Azure IoT Edge open for developers to build for the intelligent edge, George, Sam; Azure Internet of Things; Nov. 15, 2017.

Predix Edge Technology Product Brief, General Electric, 2017.

Challenges and Solutions of Protecting Variable Speed Drive Motors; Aversa, et al.; Feb. 11, 2013; Presented at the 2013 Texas A&M Conference for Protective Relay Engineers.

\* cited by examiner

DISTRIBUTED IOT BASED SENSOR ANALYTICS FOR POWER LINE DIAGNOSIS

FIELD OF TECHNOLOGY

The present invention generally relates to Internet of Things (IoT). More specifically, it relates to IoT enabled distributed computing and fault diagnosis in power lines associated with power quality parameters, such as, sag, swell, flickering, surge, harmonic distortion, and other power quality issues.

BACKGROUND

Internet of Things (IoT) is a network of uniquely-identifiable, purposed "Things" that are enabled to communicate data pertaining thereto over a wide communication network, whereby the communicated data form a basis for manipulating the operation of the "Things". The "Thing" in the Internet of Things could virtually be anything that fits into a common purpose thereof. For example, the "Thing" could be a person with a heart rate monitor implant, a farm animal with a biochip transponder, an automobile that has built-in sensors to alert its driver when tire pressure is low, or the like, or any other natural or man-made entity that can be assigned a unique IP address and provided with the ability to transfer data over a communication network. Notably, if all the entities in an IoT are machines, then the IoT is referred to as a "Machine to Machine" (M2M) IoT or simply, as M2M IoT.

It is apparent from the aforementioned examples that an entity becomes a "Thing" of an M2M IoT especially, when the entity is attached with one or more sensors capable of capturing one or more types of data pertaining thereto, segregating the data (if applicable), selectively communicating each segregation of data to one or more fellow "Things", receiving one or more control commands (or instructions) from one or more fellow "Things". The control commands are based on the data received by the fellow "Things" and executing the control commands results in the manipulation or management of the operation of the corresponding entity. Therefore, in an IoT-enabled system, the "Things" basically manage themselves without any human intervention, thus drastically improving the efficiency thereof.

U.S. Pat. No. 9,052,216 B2 discusses an energy measurement system which measures electrical parameters, such as, line-to-line voltage/current, line to neutral voltage/current, total apparent power, reactive power, active power, fundamental and harmonic total energy per phase, fundamental and harmonic reactive energy per phase, active energy per harmonic frequency per phase, reactive energy per harmonic frequency per phase, fundamental and harmonic active energy per phase.

WIPO publication WO2014089567A2 tells about automated monitoring of various sensors including sensors that measure power, voltage, current, temperature, and humidity of the power sources as well as notification triggers and alarms to a feature phone.

CN 203588054U describes wireless network sensor monitoring system used in the power environment based on Internet of things.

CN 102539911A discusses smart metering systems, large master system, digital substation and small smart metering sensor through mutual perception by the information and "Internet of Things".

US Patent publication 20120213098 A1 tells about the use of an internet of things analyzer with the function of measuring voltage, current and resistance as a regular multimeter.

U.S. Pat. No. 8,447,541 B2 discusses energy monitoring devices that are able to communicate with energy aware appliances comprising of an embedded energy monitor with connected network equipment, such as, a router or hub and a server.

None of the prior art technologies emphasizes on utilizing distributed computing, power factor calculations and use of Big Data technologies to diagnose power quality issues of the power line to reduce the cost of electronics measuring it and offering scalability for a large number of measuring points.

Aforementioned prior art technologies fail to address measurement of electrical parameters that affect power quality of power lines distributed in large numbers and over a large area. An organization with multiple locations around the world with multiple electrical lines to be monitored may be too huge to handle for the aforementioned prior art technologies. The aforementioned prior arts fail to address scale of data, frequency of data, calculation capabilities residing in a single location and so on.

It is evident from the discussion of the aforementioned prior arts that none of them pave way for distributed power line diagnosis. Therefore, there exists a need in the art for a solution to the aforementioned problem.

SUMMARY

Disclosed are a method, an apparatus and/or a system of distributed power line diagnosis.

In one aspect, a method of predicting an electrical issue includes collecting information through a processor, one or more electrical line readings from one or more IoT sensors and transmitting over a communication network and also sending pre-collected one or more electrical line readings to a machine learning engine. Further, the method includes visualizing one or more electrical line issues through a processor based on an analysis through a big data engine and indicating the one or more electrical line issues through a user interface dynamic. An alarm is set through a processor for indicating the one or more electrical line issues.

In another aspect, a distributed power line diagnosis system includes a firmware to receive a plurality of electrical line data over a wide communication network, a real time data processing system associated with distributed databases, a local firmware board, a data hub, an IoT server, a multi-classification machine learning engine associated with the IoT server, a display module associated with one or more processors and a user interface and an alarm module. A power line issue is mapped onto a depiction on a user interface. The power line issue is determined based on a computation at one or more of the local firmware board, the data hub, and the IoT server. The alarm module raises the corresponding alarm when a pre-set condition is breached. Further, the alarm module is associated with the multi-classification machine learning engine.

In yet another aspect, a method of a distributed power line diagnosis includes receiving one or more electrical readings through a firmware computation engine and transmitting an output of firmware computation engine through a communication network to a data hub computation engine. An output of the data hub computation engine is transmitted through the communication network to a big data server.

The methods and systems disclosed herein may be implemented in any means for achieving various aspects of intended results and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of the present invention are illustrated by way of example and not as limitation in the figures of the accompanying drawings in which similar elements are indicated like references.

Other features of the present embodiments will be apparent from the accompanying drawings and from the detailed description that follows.

DETAILED DESCRIPTION

The example embodiments, as described below may be used to provide a method, an apparatus and/or a system for distributed power line diagnosis. Although the present embodiments have been described with reference to specific example embodiments, it will be evident that various modifications and changes may be made to these embodiments without departing from the broader spirit and scope of the various embodiments.

Figure 1:
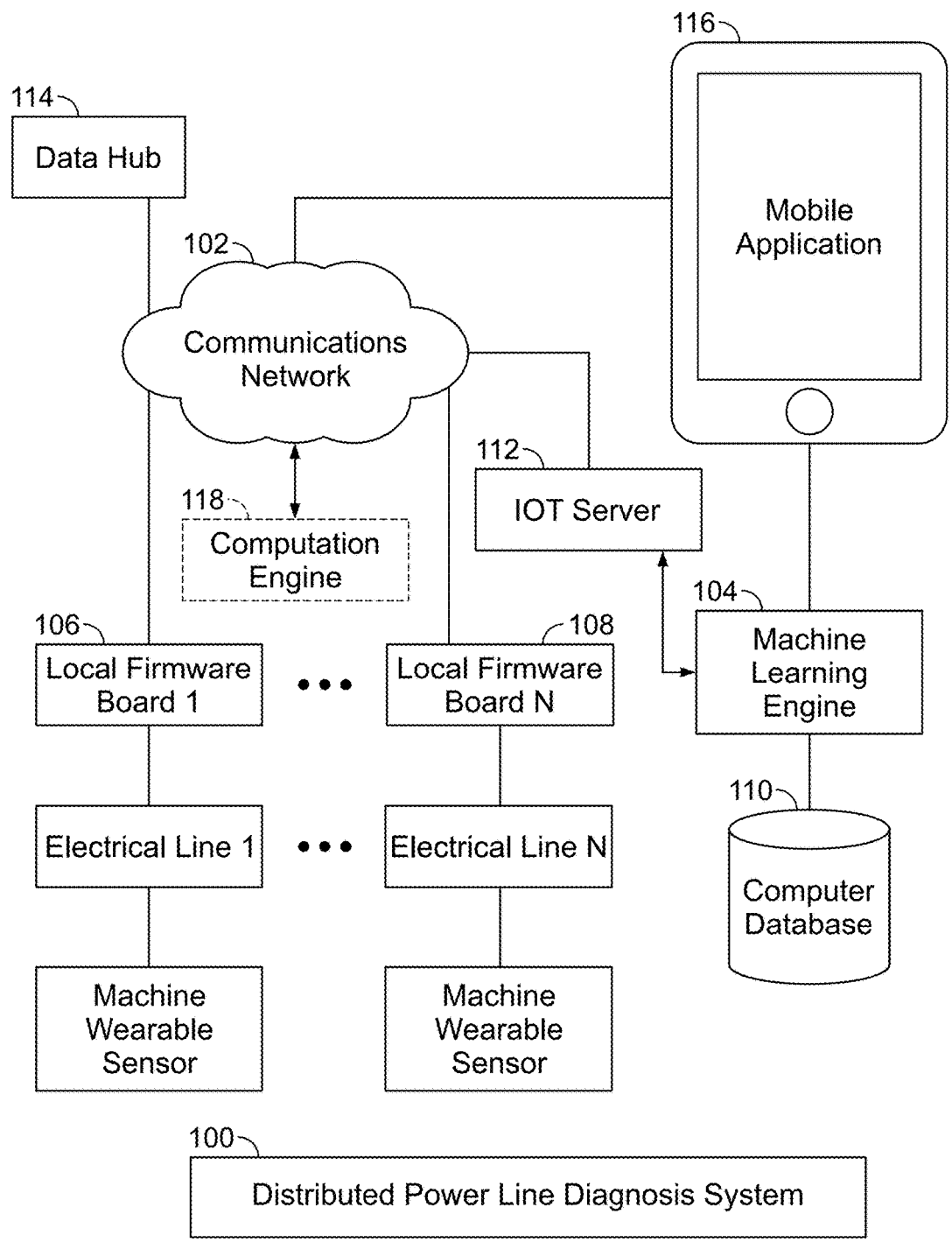
FIG. 1 is a diagrammatic representation of a distributed power line diagnosis system according to one or more embodiments.

FIG. 1 is a system diagram of a distributed power line diagnosis system 100 according to one or more embodiments. The distributed power line diagnosis system 100 includes a communication network 102, a machine learning engine 104, a local firmware board-1 106, a local firmware board n108, a computer database 110, an IoT server 112, a data hub 114, a mobile application 116 and a computation engine 118.

In one or more embodiments, the distributed power line diagnosis system 100 may include a firmware to receive a plurality of electrical line data over a communication network 102. The firmware may be associated with a local firmware board. The local firmware board may, in turn be associated with the computation engine 118. A real time data processing system may be associated with distributed databases and the local firmware board, such as, local firmware board-1 106. The computation engine 118 may transmit a computation data associated with the local firmware board-1 106 to a data hub 114 over the communication network 102. The data hub 114 may in turn be associated with the computation engine 118. The computation engine 118 may transmit a computation associated with the data hub 114 to an IoT server 112 over the communication network 102. The IoT server 112 may compute and determine a power line issue through an analysis. The IoT server 112 may compute and determine parameters to be shown based on an association with the computation engine 118 and the multi-classification machine learning engine 104. The IoT server 112 may refer to one or more servers that run across geo-distributed computers and a cloud environment. The cloud environment may be associated with the communications network 102.

Further, the multi-classification machine learning engine 104 may be associated with the IoT server 112. A display module associated with one or more processor and a user interface. The processor and the user interface may in turn be associated with the mobile application 116. A power line issue may be mapped onto a depiction on the user interface. An alarm module may raise an alarm when a pre-set condition is breached. The pre-set condition may be associated with one of an electrical line fault and an electrical line failure. The alarm module may be associated with the multi-classification machine learning engine 104.

In one or more embodiments, local firmware boards 1 to n may be associated with electrical lines 1 to n.

However, one of the issues of analytics may be effective visualization of the processed results and/or alarm system. In one approach, results may be mapped into a simple "Circular Gauge" with a normalized scale of 0-100, where a user can set such scale for setting up their alarm and scaling up their predictive maintenance issue on the electrical line issues. Thus, complex results of Big Data IoT analytics associated with electrical line faults may be visualized by applying the techniques disclosed herein.

The results may be visualized through a web and/or mobile application. The web and/or mobile application may be associated with device, such as, personal computers, laptops, mobile device, tablets etc.

In one or more embodiments, a retrofit sensor mounting may be used to monitor power quality issues. The power monitoring may be, for example, in a factory with multiple machines. Various parameters monitored and/or measured may include current (example: 0-100 A), voltage (example: 0-600V), power factor (example: 0-1.0 lag/lead), harmonic distortion (%), swell (pu), surge (pu), sag (pu), active power (kW), reactive power (kVAR), and frequency (50-60 Hz). Sensor data may be fed to a cloud server via a data hub (such as, a mobile app). The data hub may collect, analyze and store the sensor data using Big Data technology (such as, Kafka, NoSQL, Cassandra and map reduced systems like Apache Spark).

In one or more embodiments, big data may be a term used to refer to large data sets. The data sets may be so large and complex that traditional data processing systems may be inadequate to handle the data sets. The data collected at IoT sensors associated with electrical lines may be extremely large and complex. The data may be collected onto a big data server over a cloud. The big data server may refer to distributed one or more servers associated with the IoT sensors.

In one or more embodiments, data may be collected with primary meta-data classification, such as, "Baseline" and "Test", where baseline refers to normal operating condition and/or a condition referred to a healthy machine. Test data may be classified according to the need of testing. Historical statistics like energy consumption of different loads, machines, shifts, etc., may be tracked using an energy efficient mechanism. Additional devices may be available for power line filtering.

In an example embodiment, sensor data may be determined from a sensor, such as, a machine wearable sensor. The sensor may be associated with an electrical line.

In one or more embodiments, the communication network 102 may be one of a WiFi, 2G, 3G, 4G, GPRS, EDGE, Bluetooth, ZigBee, Piconet of BLE, Zwave or a combination thereof.

In one or more embodiments, the machine learning engine 104 may be associated with a machine learning algorithm.

Figure 4:
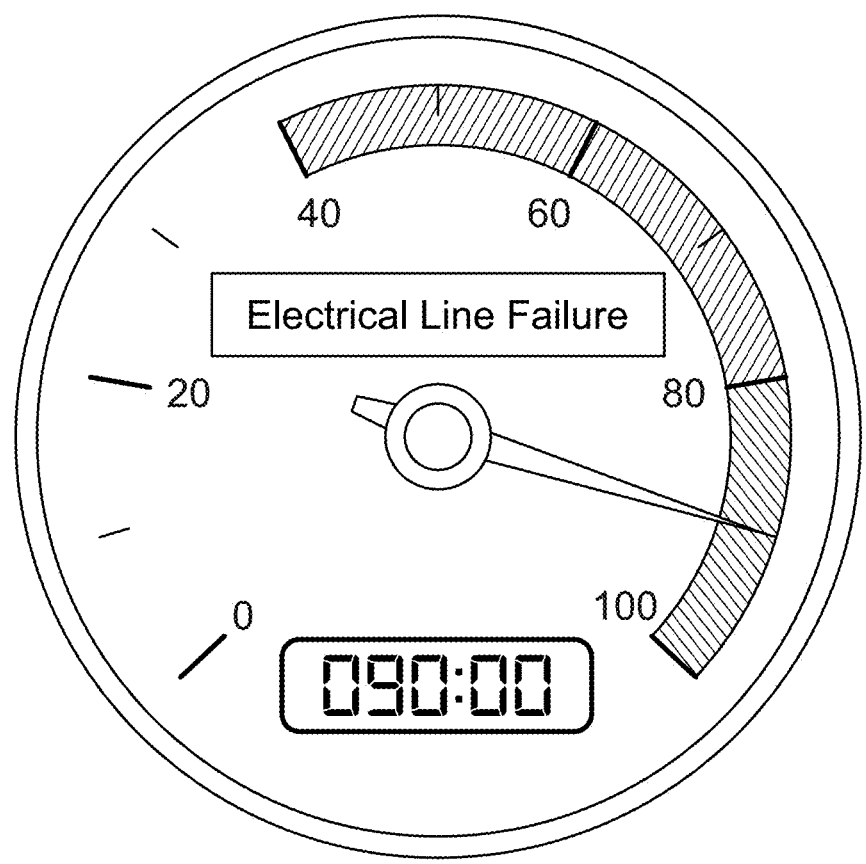
FIG. 4 is a diagrammatic representation of a circular gauge to depict a state of an electrical line, according to one example embodiment.

In an example embodiment, the depiction on a user interface may be a circular gauge type representation as shown in FIG. 4.

In one or more embodiments, the circular gauge may be associated with color schemes, such as, red, yellow and green. In an exemplary embodiment, the color scheme red may indicate an alarming electrical line condition, yellow may indicate an impending electrical line issue and green may indicate a healthy electrical line.

In one or more embodiments, an electrical line may also be referred to as a power line.

In one or more embodiments, an alarm may be raised when color scheme is one of a yellow and a red.

In one or more embodiments, a method of predicting electrical line issues may include multiple steps of: collecting data associated with one or more electrical line readings from one or more sensors capable of local computation of time series data of electrical sensors transmitted over a communication network. The data may be collected over a finite time period and transmitted to a machine learning engine. The machine learning engine may be associated with a computer database hosting real time and historical data. One or more electrical line issues based on an analysis through a big data engine may be visualized. The one or more electrical line issues may be indicated through a user interface dynamic. An alarm may be set for one or more electrical line issues.

In an example embodiment, electrical line data, such as, from electrical lines 1-n may be collected onto local firmware boards 1-n. The local firmware boards 1-n may transmit computed values from multiple locations over a wide communication network 102 onto the data hub 114 for further computation in association with the computation engine 118. The data hub 114 may collect data from multiple geo-distributed locations and compute pre-defined entities. The pre-defined entities may be defined by a user. One or more data hubs, such as, data hub 114 may transmit computed data to an IoT server 112. The IoT server 112 in association with a machine learning engine 104 may analyze and determine an electrical line issue. An alarm may be raised over the communication network 102 through one of a notification on the mobile application, Short message service (SMS), email, or a combination thereof. The alarm may be raised, when a pre-defined condition for an electrical line is breached.

In one or more embodiments, a method of predicting an electrical issue may include collecting one or more electrical line readings from one or more IoT sensors through a processor and transmitting over a communication network and also sending the one or more collected electrical line readings to a machine learning engine. Further, the method may include visualizing, one or more electrical line issues through a processor based on an analysis through a big data engine and indicating the one or more electrical line issues through a user interface dynamic. The user interface dynamic may be a predictive maintenance circular gauge. An alarm may be set, through a processor, for the one or more electrical line issues.

In one or more embodiments, the machine learning engine may be associated with a machine learning algorithm. The machine learning engine may be capable of receiving electrical line data from one or more sensors. The machine learning engine may process the received data to recognize one of a pattern and a deviation to issue alarm and control commands pertaining to the electrical line in association with the communications network.

Further, the machine learning engine may be associated with a multi-classification engine, such as, an oblique and/or support vector machine. The support vector machines may be supervised learning models with associated learning algorithms that analyze data and recognize patterns. The supervised learning models may be used for classification and regression analysis.

In one or more embodiments, steps of the multi-classification engine may include data transformation to achieve maximum separation among fault types. The data transformation may lead to more accurate multi classification, for example, linear discriminant functions. Further, nonlinear hyper plane fitting may be done to classify different fault types, for example, quadratic hyper planes in transformed variable space, developing a measure to represent the degree of fault based on machine learning multi-fault classification approach. The intensity of fault may be calculated, for example, posterior probability of fault type. The degree of fault information may be mapped onto the circular gauge, such as, in FIG. 11. For example, different fault type posterior probabilities may be combined to get circular gauge representation. User calibration of the circular gauge may be enabled to include user intuition about the machine state into the analytics process. The multi classification may end when the user agrees with the circular gauge.

In one or more embodiments, a distributed power line diagnosis system may be comprised of one or more firmware computation engines to receive a plurality of electrical line data over a communication network, a real time data processing system associated with distributed databases, a local firmware board, a data hub, an IoT server, a multi-classification machine learning engine associated with the IoT server, a display module associated with one or more processors and a user interface and an alarm module. A power line issue may be mapped for depiction on a user interface. The power line issue may be determined based on a computation at one or more of the local firmware board, the data hub and the IoT server. The alarm module may raise an alarm when a pre-set condition is breached. Further, the alarm module may be associated with the multi-classification machine learning engine.

In one or more embodiments, a method of a distributed power line diagnosis may include one or more electrical readings received at a firmware board computation engine and an output of firmware board computation engine being transmitted through a communication network to a data hub computation engine. An output of the data hub computation engine may be transmitted through the communication network to a big data server. One or more electrical line issues may be visualized based on an analysis through the big data server and the electrical line issues are indicated through a user interface dynamic. An alarm may be raised for the one or more electrical line issues.

The mobile application 116 may receive and/or display I_RMS (root mean square value of current), V_RMS (root mean square value of voltage), PF (power factor), Active power, Reactive Power and Frequency for each machine. Further, the mobile application 116 may display alarm threshold using a circular gauge.

Further, the mobile application may display historical data associated with a machine and/or an electrical line for a time limit, such as, 3 months and meta-data for a time limit, such as, 24 hours.

The mobile application may allow a user to select a filter window, such as, last 24 hours, between any two dates, last week, last month, last 3 months and so on. The selected window may allow the user to view a daily maximum power/minimum power chart, average power usage by hour, by day, by month and time of the day when power peaks. Further, the user may compare average and peak power usage between machines.

In one or more embodiments, the distributed power line diagnosis system may utilize multi-layer big gauge based Big Data visualization to simplify issues and alarms associated with electrical power line, such as, active power, reactive power, voltage, current, power factor, sag, swell, surge, harmonic distortion etc.

The distributed power line diagnosis system may include two layers, first front layer being a gauge (single or multi-parametric or multi-dimensional) and second layer being analytical. A user may set an alarm for electrical line issues, such as, say, swell etc. based on direct rules and/or multi-classification machine learning algorithm using a Base-Line (BL) calibration method.

Figure 2:
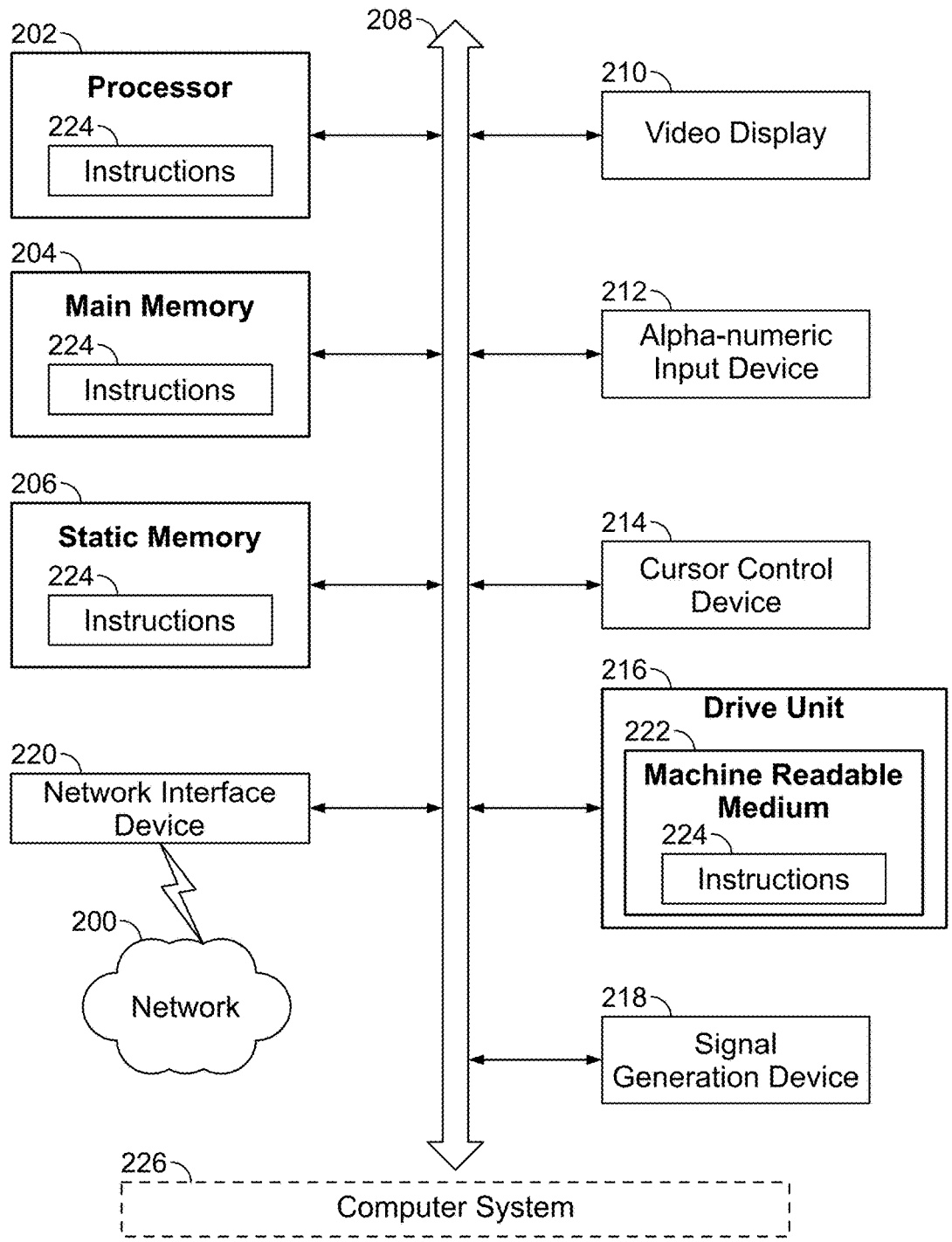
FIG. 2 is a diagrammatic representation of a data processing system capable of processing a set of instructions to perform any one or more of the methodologies herein, according to one embodiment.

FIG. 2 is a diagrammatic representation of a data processing system capable of processing a set of instructions to perform one or more of the methodologies herein, according to an example embodiment. FIG. 2 shows a diagrammatic representation of machine in an exemplary form of a computer system 226 within which a set of instructions, for causing the machine to perform any one or more of the methodologies discussed herein, may be executed. In various embodiments, the machine operates as a standalone device and/or may be connected, for example, networked, to other machines.

In a networked deployment, the machine may operate in the capacity of a server and/or a client machine in server-client network environment and or as a peer machine in a peer-to-peer (or distributed) network environment. The machine may be a Personal-Computer (PC), a tablet PC, a Set-Top Box (STB), a Personal Digital Assistant (PDA), a cellular telephone, a web appliance, a network router, a switch and/or bridge, an embedded system and/or any machine capable of executing a set of instructions (sequential and/or otherwise) that specify actions to be taken by that machine. Further, while only a single machine is illustrated, the term "machine" shall also be taken to include any collection of machines that individually or jointly execute a set (or multiple sets) of instructions to perform one and/or more of the methodologies discussed herein.

For example, computer system 226 includes a processor 202, for example, a central processing unit (CPU) or a graphics processing unit (GPU) or both), a main memory 204 and a static memory 206, which communicate with each other via a bus 208. The computer system 226 may further include a display unit 210, for example, a liquid crystal displays (LCD) and/or a cathode ray tube (CRT)). The computer system 226 also includes an alphanumeric input device 212 (for example, a keyboard), a cursor control device 214 (for example, a mouse), a disk drive unit 216, a signal generation device 218 (for example, a speaker) and a network interface device 220.

The disk drive unit 216 includes a machine-readable medium 222 on which is stored one or more sets of instructions 224 (for example, software) embodying any one or more of the methodologies and/or functions described herein. The instructions 224 constituting machine-readable media may also reside completely or at least partially, within the main memory 204 and/or within the processor 202 during execution thereof by the computer system 226, the main memory 204 and the processor 202.

The instructions 224 may further be transmitted and/or received over a network 200 via the network interface device 220. While the machine-readable medium 222 is shown in an example embodiment to be a single medium, the term "machine-readable medium" should be taken to include a single medium and/or multiple media (for example, a centralized and/or distributed database, and/or associated caches and servers) that store the one or more sets of instructions. The term "machine-readable medium" shall also be taken to include any medium that is capable of storing, encoding and/or carrying a set of instructions for execution by the machine and that cause the machine to perform any one or more of the methodologies of the various embodiments. The term "machine-readable medium" shall accordingly be taken to include, but not be limited to solid-state memories, optical and magnetic media, and carrier wave signals.

Figure 3:
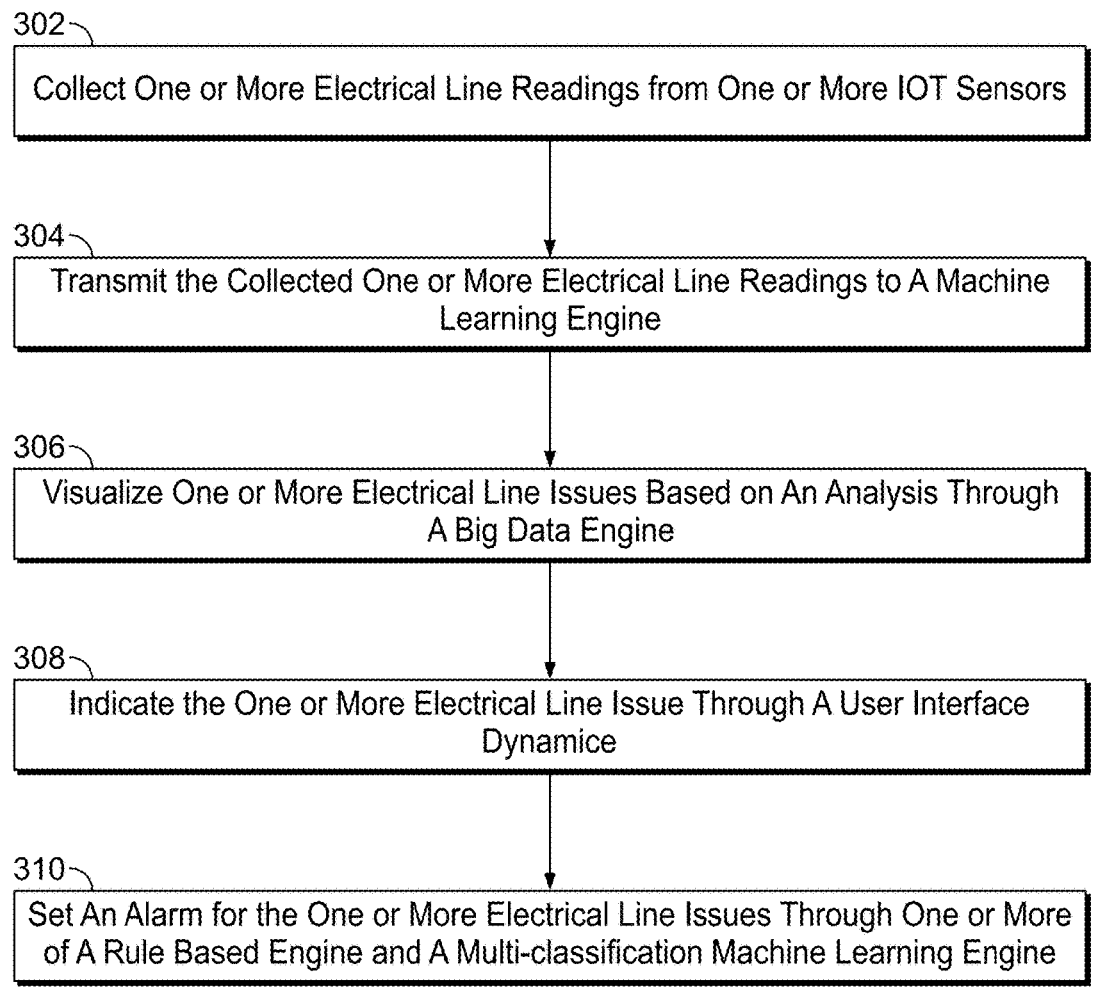
FIG. 3 is a process flow diagram detailing the operations of a method of predicting electrical line issues, according to one or more embodiments.

FIG. 3 is a process flow diagram detailing the operations of a method of predicting an electrical line issue, according to one or more embodiments. A method of predicting an electrical line issue may comprise the steps of (i) collecting one or more electrical line readings from one or more IoT sensors 302, (ii) transmitting the collected one or more electrical line readings to a machine learning engine 304, (iii) visualizing one or more electrical line issues based on an analysis through a big data engine 306, (iv) indicating the one or more electrical line issues through a user interface dynamic 308 and (v) setting an alarm for the one or more electrical line issues through one or more rule based engines and a multi-classification machine learning engine 310.

In one or more embodiments, a method of a distributed power line diagnosis may predict sag, surge and swell through one or more power factors, peak value, harmonics etc. based on the analysis by a machine learning engine.

FIG. 4 is a diagrammatic representation of a circular gauge to depict a state of an electrical line, such as, electrical line failure according to one example embodiment.

Figure 5:
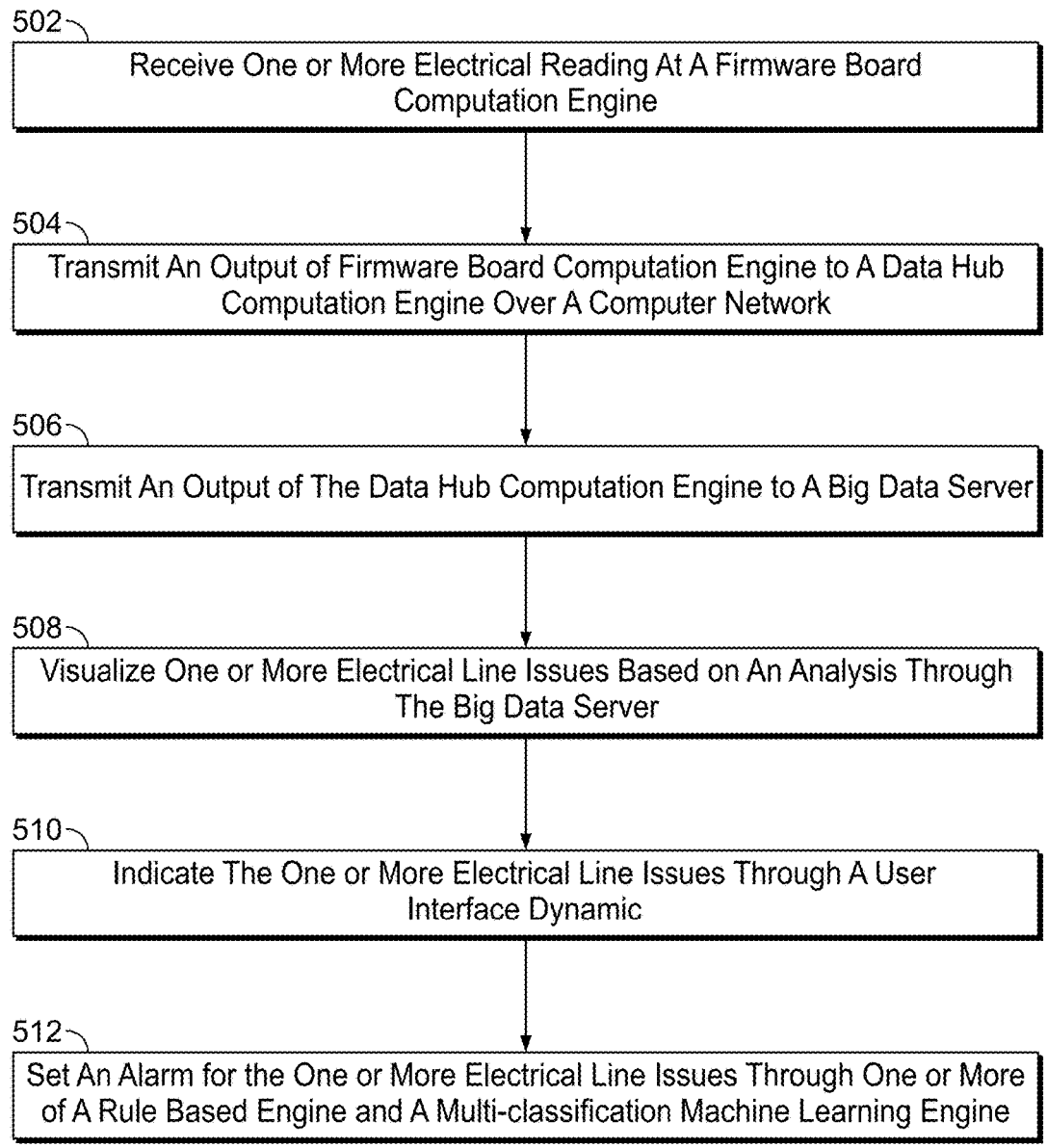
FIG. 5 is a process flow diagram detailing the operations of a method for distributed power line diagnosis, according to one or more embodiments.

FIG. 5 is a process flow diagram detailing the steps of distributed power line diagnosis, according to one embodiment. In one or more embodiments, steps of distributed power line diagnosis may include (i) receiving one or more electrical readings at a firmware board computation engine as in step 502, (ii) transmitting an output of firmware board computation engine to a data hub computation engine over a computer network as in step 504, (iii) transmitting an output of the data hub computation engine to a big data server as in step 506, (iv) visualizing one or more electrical line issues based on an analysis through the big data server as in step 508, (v) indicating the one or more electrical line issues through a user interface dynamic as in step 510 and (vi) setting an alarm for the one or more electrical line issues through one of a rule based engine and a multi-classification machine learning engine as in step 512.

In an example embodiment, the distributed power line diagnosis system may be based on IoT (Internet of Things). The IoT based distributed power line diagnosis system may include sensors, such as, machine wearable sensors. Further, the system may be used for overseeing predictive maintenance of one or more power lines. The system may include a plurality of machine-wearable sensors, each of which may be associated with a power line. Each sensor is capable of transmitting captured power line data over a wireless communication network. The system may further include a sensor network for receiving and transmitting the captured data over a communication network and a machine learning algorithm engine capable of receiving and analyzing data from the sensor network. The machine learning algorithm engine may process the received data to recognize one of a pattern and a deviation to issue control commands pertaining to the machine. Lastly, the system may include one or more control modules disposed in operative communication with a local firmware board associated with the power line where the local firmware board is capable of receiving and sending one or more control commands, executing the control commands, transmitting calculated/computed data over a communication network.

In an example embodiment, the machine learning engine 104 may raise an alarm when an electrical line failure is detected. The machine learning engine 104 may be associated with an IoT server 112. The machine learning engine 104 may issue commands based on a learning outcome from an analysis of distributed calculations.

In one or more embodiments, a three stage computation may be necessary for distributed power line diagnosis. First computation may be at the local firmware board, second computation at the data hub and last computation at the IoT server. A computation engine may be associated with one or more of the local firmware board, the data hub and IoT server over a communication network.

In one or more embodiments, a learning outcome as a result of analysis at IoT server may be dependent on recognition of one of a pattern and deviation recognized by the machine learning engine.

In an example embodiment, data may be collected from diverse locations, such as, 10,000 factory locations for 3P (prescriptive, preventative and predictive) maintenance by using a combination of Cassandra (distributed database), Storm and/or Spark real time to process the data in a real time Big Data architecture using a broker system, such as, Kafka for storing the alarms as buffer database and then using Storm and/or Cassandra like distributed database for an MRO (Maintenance, Repair and Operation) system. The real time Big Data architecture may be associated with the IoT server.

In one or more embodiments, 3P maintenance may be a possibility for an electrical line. Big data methodologies may be employed to analyze data obtained from various locations through an IOT sensor network. Big data may be used to describe a massive volume of both structured and unstructured data. Large volumes of data may be difficult to process using a traditional database and traditional software techniques. Therefore, a distributed real-time computation system, such as, Apache Storm may be used for distributed power line diagnosis.

In an example embodiment, a real time data processing system may be associated with distributed databases. The real time data processing system may be a big data system.

In one or more embodiments, one or more electrical line issues may be determined based on one or more computations. Further, the determination may be based on an analysis associated with a machine learning engine.

In one or more embodiments, an alarm may be set through one of a rule based engine and a multi-classification machine learning engine.

In one or more embodiments, the communication network is one of Wi-Fi, 2G, 3G, 4G, GPRS, EDGE, Bluetooth, ZigBee, Piconet of BLE, Zwave or a combination thereof.

In one or more embodiments, an alarm may be raised over the communication network, through one of a notification on the mobile application, Short Message Service (SMS), email or a combination thereof.

In one or more embodiments, a computation engine may be associated with one or more local firmware boards, a data hub and an IoT server.

Power supply quality may be inconsistent and/or poor. Poor and/or inconsistent power supply may lead to increased maintenance costs for equipment. Power quality may be a major issue particularly when sensitive electronic equipment are used in varying internal loads within plants. Reasons ranging from variable speed drives, microprocessor based devices, loads, such as, lighting and battery charges also contribute to the quality of electric power in a circuit. The above reasons may cause poor power factor, harmonics and power quality events, such as, sag, swell and surge.

In one or more embodiments, a power quality monitoring system may use an Internet of Things (IoT) based architecture for round the clock power quality tracking of machines. The power quality monitoring system may include sensor on chip technology, wireless network and a computation engine. The power quality monitoring system may reduce operation costs of the machines by a large percentage. Reduction in costs may be achieved through a combination of single silicon chip, open source networking and cloud based software. Power monitoring sensors may track harmonic distortion, swell, sag, surge, flickering etc.

In one or more embodiments, snap-split-core sensors may be installed onto three phase lines going into machines and then a data-hub may collect data from the sensors through a wireless network. The data may be pushed to a Cloud server from which a processor receives a summary of issues in the three phaselines going into individual machines in real time. The data may be available on a smart phone and/or tablet registered with an application.

Figure 6:
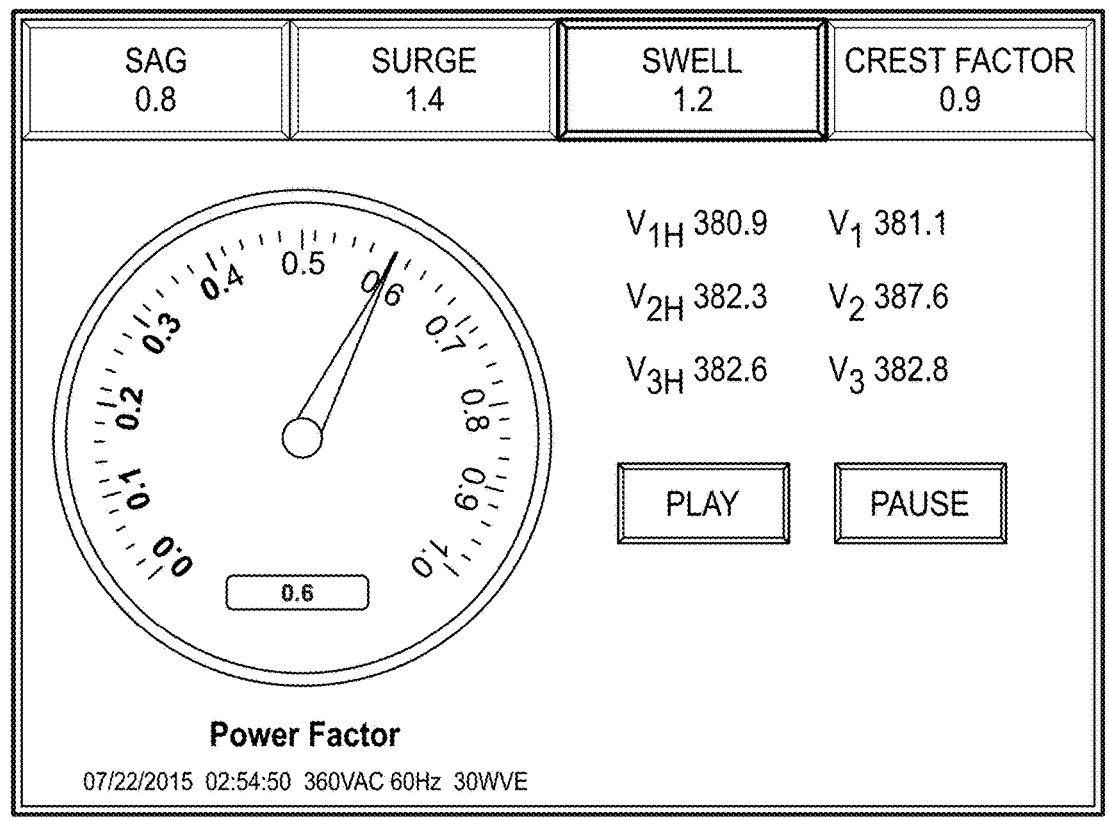
FIG. 6 is a diagrammatic representation of real time diagnosis and view on mobile application, according to one embodiment.

FIG. 6 is a diagrammatic representation of real time diagnosis and view on mobile application according to one embodiment.

Figure 7:
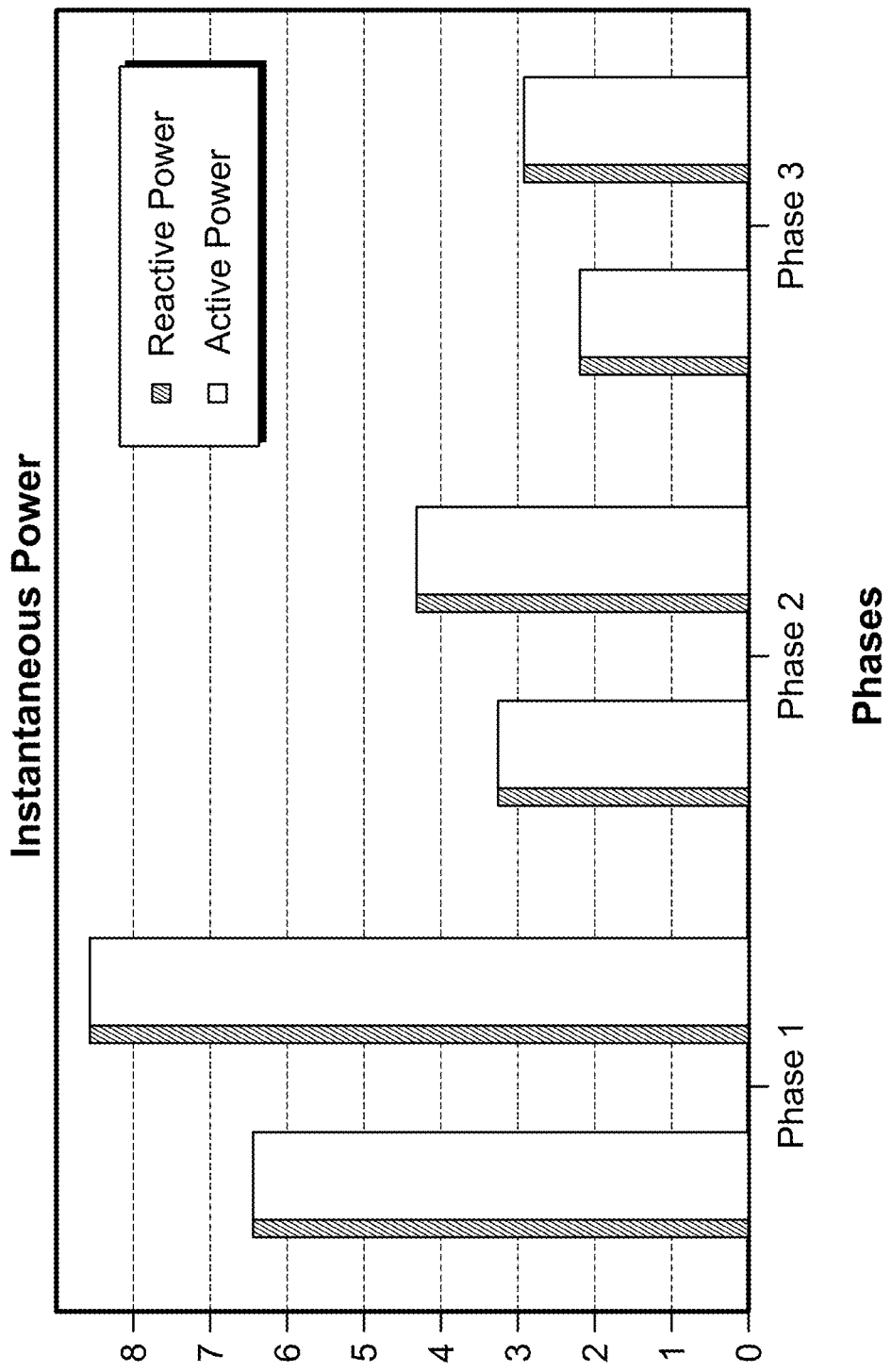
FIG. 7 is a diagrammatic representation of instant power measurement, according to one embodiment.

FIG. 7 is a diagrammatic representation of instant power measurement according to one embodiment.

Figure 8:
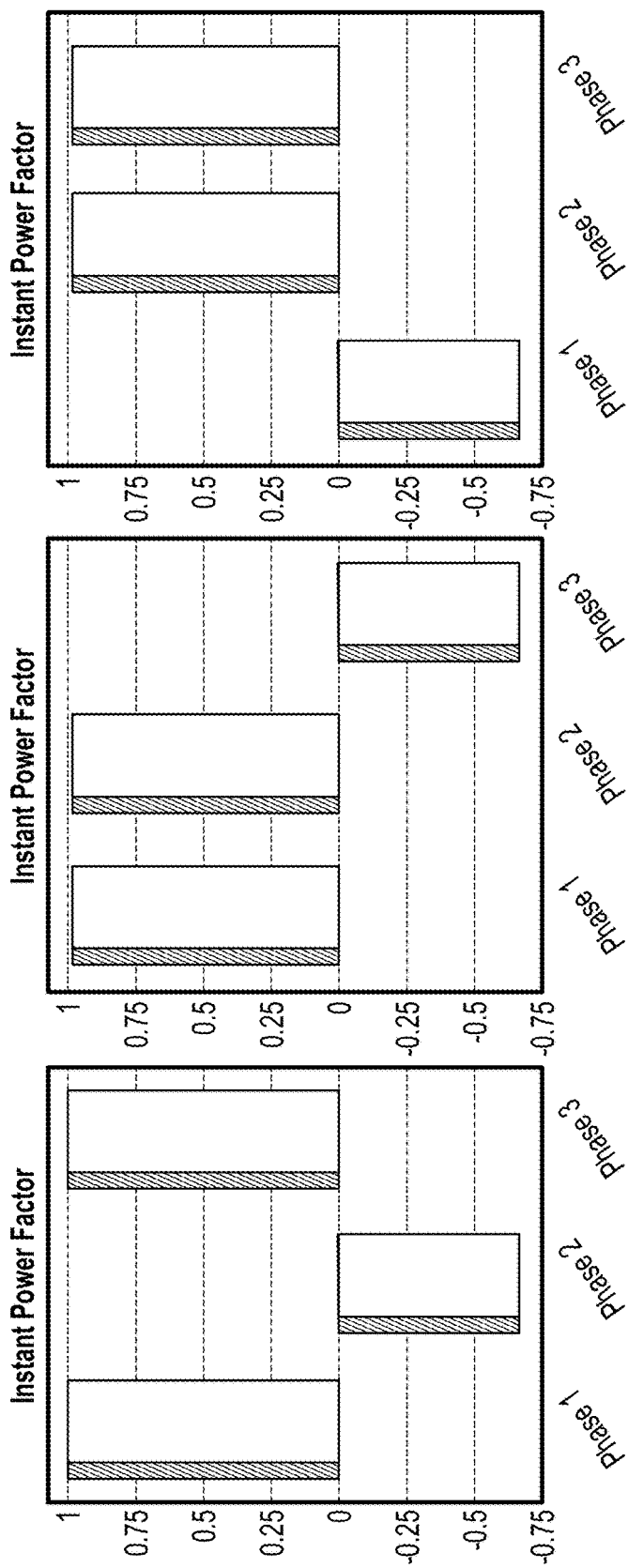
FIG. 8 is a diagrammatic representation of instant power factor measurement, according to one embodiment.

FIG. 8 is a diagrammatic representation of instant power factor measurement according to one embodiment.

Figure 9:
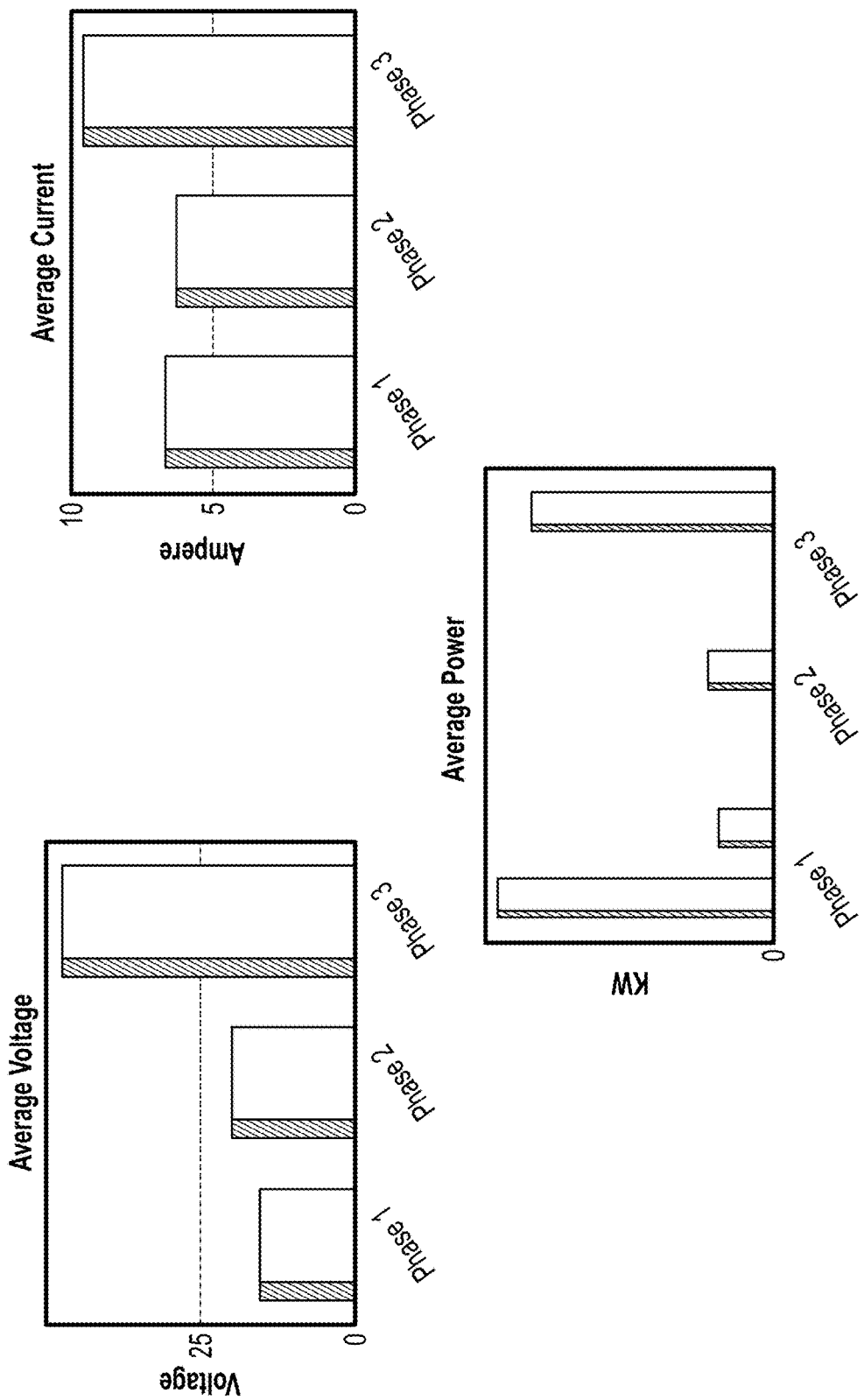
FIG. 9 is a diagrammatic representation showing averages of historical data collected over a few days, according to one embodiment.

FIG. 9 is an example showing averages of historical data collected over a few days according to one embodiment.

Figure 10:
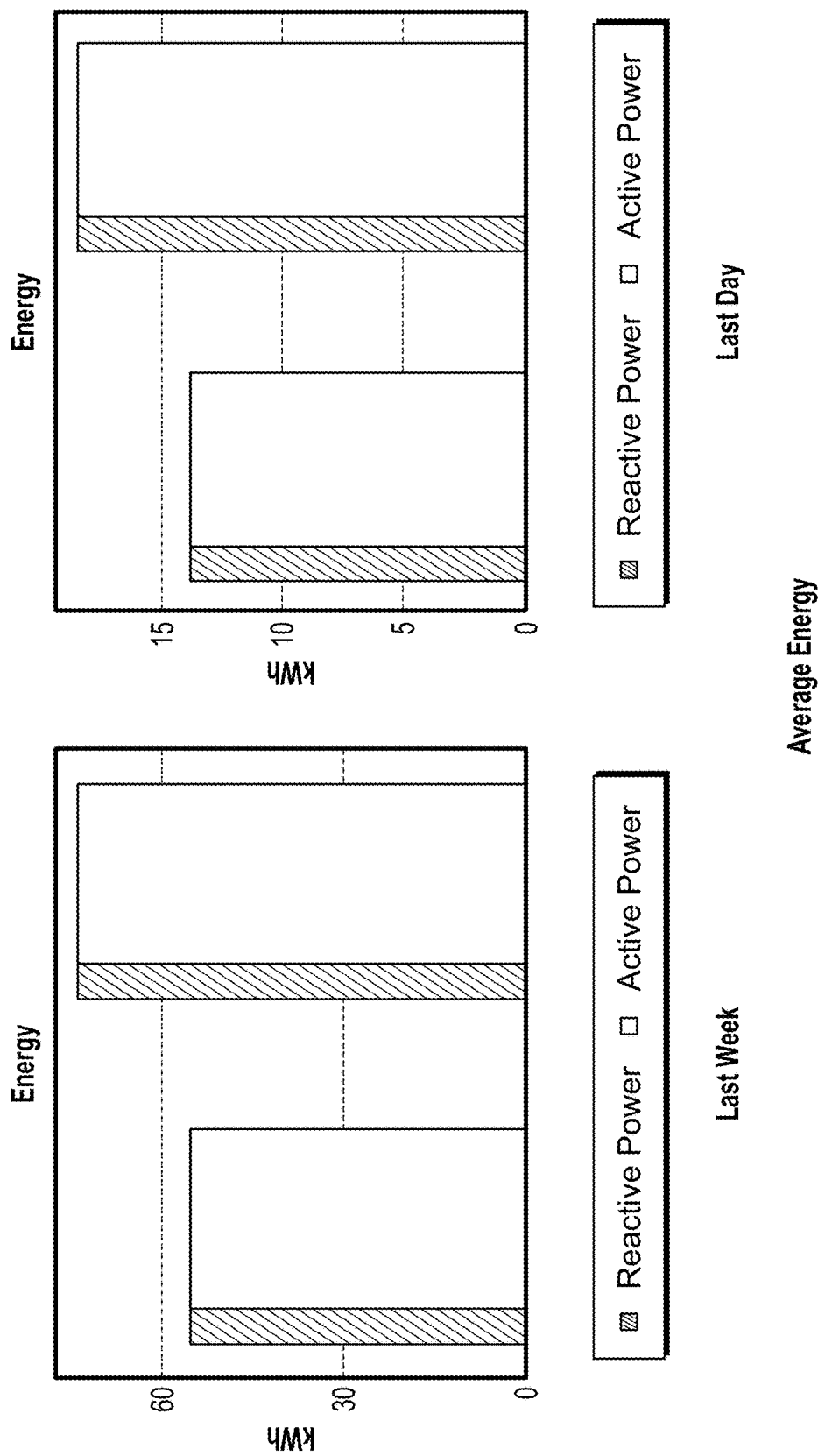
FIG. 10 is a diagrammatic representation of a comparison between data obtained over a week and current data, according to one embodiment.

FIG. 10 is a diagrammatic representation of a comparison between data over a week and current data according to one embodiment.

Figure 11:
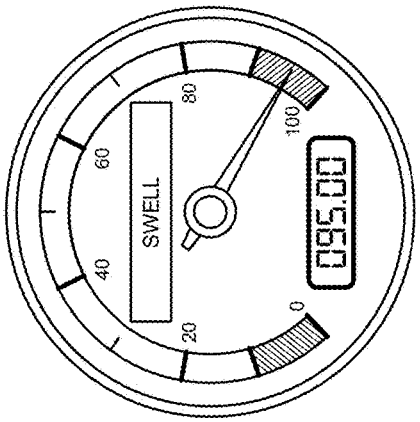
FIG. 11 is a diagrammatic representation of a predictive maintenance circular gauge associated with an electrical line, according to one embodiment.
Figure 11:
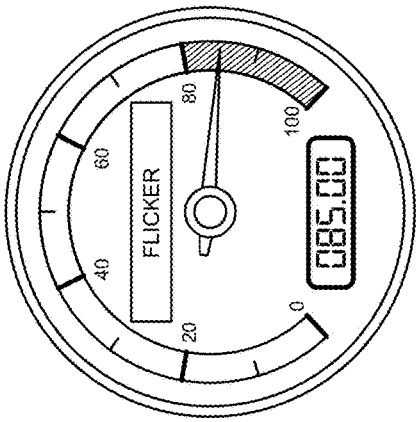
Figure 11:
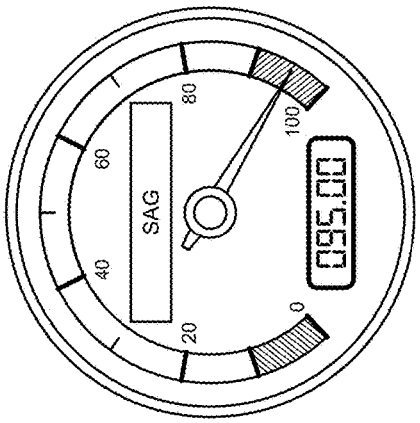
Figure 11:
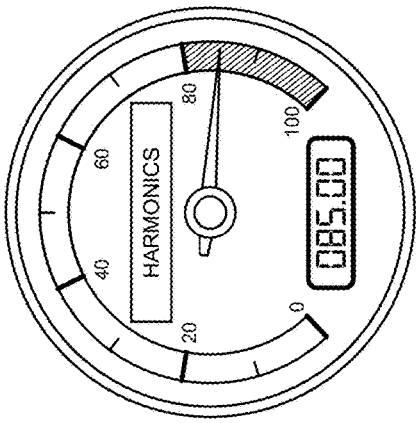
Figure 11:
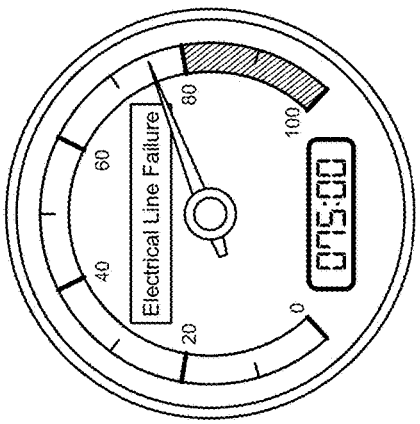
Figure 11:
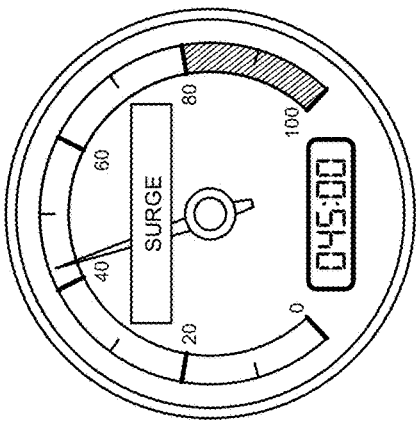

FIG. 11 is a diagrammatic representation of a predictive maintenance circular gauge associated with an electrical line, according to one embodiment. The predictive maintenance circular gauge may depict various electrical line issues, such as, electrical line failure, sag, surge, swell, harmonics and flickering.

The predictive maintenance circular gauge may be associated with one or more color indications. The color indications may include red, yellow and green states. The red may indicate a danger mode of operation wherein the electrical line may one of have failed and/or the electrical line is about to fail. The yellow may indicate an intermediate state of operation for an electrical line that the predictive maintenance gauge is associated with. The green state may indicate an ideal and/or smooth state of operation for the electrical line the predictive maintenance circular gauge is associated with.

In one or more embodiments, an alarm may be raised when color scheme is one of a yellow and a red.

In one or more embodiments, IoT sensors may be enabled to compute time series data.

Although the present embodiments have been described with a reference to specific example embodiments, it will be evident that various modifications and changes may be made to these embodiments without departing from the broader spirit and scope of the various embodiments. For example, the various devices and modules described herein may be enabled and operated using hardware circuitry, firmware, software or any combination of hardware, firmware, and software (for example, embodied in a machine readable medium). For example, the various electrical structure and methods may be embodied using transistors, logic gates and electrical circuits (for example, application specific integrated (ASIC) circuitry and/or in Digital Signal Processor (DSP) circuitry).

In addition, it will be appreciated that the various operations, processes and methods disclosed herein may be embodied in a machine-readable medium and/or a machine accessible medium compatible with a data processing system (for example, a computer devices) and may be performed in any order (for example, including using means for achieving the various operations). The medium may be, for example, a memory, a transportable medium, such as, a CD, a DVD, a Blu-ray™ disc, a floppy disk, or a diskette. A computer program embodying the aspects of the exemplary embodiments may be loaded onto a retail portal. The computer program is not limited to specific embodiments discussed above and may, for example, be implemented in an operating system, an application program, a foreground or background process, a driver, a network stack or any combination thereof. The computer program may be executed on a single computer processor or multiple computer processors.

Accordingly, the specifications and drawings are to be regarded in an illustrative rather than a restrictive sense.

What is claimed is:

1. A method of predicting electrical line issues, the method comprising:
    a) collecting through a processor, data associated with at least one electrical line reading from one or more sensors capable of local computation of time series data of electrical sensors transmitted over a communication network;
        i) wherein the data collected is over a finite time period and transmitted to a machine learning engine, and
        ii) wherein the machine learning engine is associated with a computer database hosting real time and historical data;
    b) visualizing, through a processor, at least one electrical line issue based on an analysis through a big data engine;
    c) determining the at least one electrical line issue based on one or more computations;
    d) indicating the at least one electrical line issue through a user interface dynamic; and,
    e) setting an alarm, through a processor, for the at least one electrical line issue;
    wherein a computation engine enables the one or more computations;
    wherein the alarm is set through at least one of a rule based engine and multi-classification machine learning engine;
    wherein the user interface dynamic is a predictive maintenance circular gauge; and
    wherein the electrical line issue includes at least one of swell, surge, harmonics, sag and flickering.

2. A distributed power line diagnosis systenciin which at least one power line issue is determined based on one or more computations comprising;
    a) a firmware to receive a plurality of electrical line data over a communications network;
    b) a real time data processing system associated with distributed databases;
    c) a local firmware board;
    d) a data hub;
    e) an IoT server;
    f) a multi-classification machine learning engine associated with the IoT server;
    g) a display module associated with one or more processors and user interface; wherein a power line issue is mapped onto a depiction on a user interfaces; and wherein the power line issue is determined based on a computation through at least one of the local firmware board, the data hub, and the IoT server; and
    h) an alarm module to raise an alarm when a pre-set condition is breached; wherein the alarm module is associated with the multi-classification machine learning engine.

3. The system of claim 2, wherein the IoT server further comprises a computation engine, operatively connected to the data processing system, the distributed databases, the data hub and the learning engine enabling one or more computations.

4. The system of claim 3, wherein the distributed computation engine computes in one or more of:
    i) the local firmware board;
    ii) the data hub; and
    iii) the IoT server.

5. The system of claim 4, wherein the alarm is set through at least one of a rule based engine and a multi-classification machine learning engine;
    wherein the depiction on the user interface is a predictive maintenance circular gauge;
    wherein the communication network is one of Wi-Fi, 2G, 3G, 4G, GPRS, EDGE, Bluetooth, ZigBee, Piconet, Zwave, or a combination thereof;
    wherein the alarm is raised over the communication network through one of a notification on the mobile application, Short Message Service (SMS), email or a combination thereof.

6. A method of diagnosing distributed power line issues comprising:
    a) receiving at least one electrical reading at a firmware board computation engine;

b) transmitting an output of firmware board computation engine to a data hub computation engine over a communication network;
c) transmitting an output of the data hub computation engine to a big data server, wherein a machine learning engine is associated with at least one of the big data server and a computer database hosting historical data;
d) determining at least one electrical line issue based on one or more computations on the big data server using the historical data;
e) visualizing at least one electrical line issue based on an analysis through the big data server;
f) indicating at least one electrical line issue through a user interface dynamic; and
g) setting, through a processor, an alarm for at least one electrical line issue through at least one of a rule based engine and a multi-classification machine learning engine;

wherein the alarm is set through at least one of a rule based engine and multi-classification machine learning engine;

wherein the user interface dynamic is a predicative maintenance circular gauge;

wherein the communications network is one of WiFi, 2G, 3G, 4G, GPRS, EDGE, Bluetooth, ZigBee, Piconet of BLE, Zwave or a combination thereof;

wherein the alarm is raised over the communication network through one of a notification on the mobile application, Short Message Service (SMS), email or a combination thereof.

* * * * *